United States Patent
Poon (10) Patent No.: US 10,491,107 B2
(45) Date of Patent: Nov. 26, 2019

(54) METHOD FOR CONTROLLING POWER FACTOR CORRECTION CIRCUIT, CONTROLLER AND SYSTEM

(71) Applicant: Murata Manufacturing Co., Ltd., Nagaokakyo-shi, Kyoto-fu (JP)

(72) Inventor: Hung Piu Poon, Hong Kong (CN)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/245,490

(22) Filed: Jan. 11, 2019

(65) Prior Publication Data

US 2019/0222117 A1 Jul. 18, 2019

(30) Foreign Application Priority Data

Jan. 15, 2018 (CN) .......................... 2018 1 0038232

(51) Int. Cl.
  *H02M 1/42* (2007.01)
  *G05B 11/42* (2006.01)
  *H03K 7/08* (2006.01)
  *H02M 1/12* (2006.01)
  *H02M 1/00* (2006.01)

(52) U.S. Cl.
  CPC .......... *H02M 1/4225* (2013.01); *G05B 11/42* (2013.01); *H02M 1/12* (2013.01); *H02M 1/4233* (2013.01); *H03K 7/08* (2013.01); *H02M 2001/0009* (2013.01); *H02M 2001/0016* (2013.01); *H02M 2001/0022* (2013.01); *H02M 2001/0025* (2013.01)

(58) Field of Classification Search
  None
  See application file for complete search history.

(56) References Cited

U.S. PATENT DOCUMENTS

| | | | | |
|---|---|---|---|---|
| 8,861,230 | B2 * | 10/2014 | Sigamani | H02M 1/4225 363/34 |
| 2012/0014152 | A1 * | 1/2012 | Nakamura | H02M 1/4258 363/126 |
| 2015/0364989 | A1 * | 12/2015 | Chung | H02M 1/12 363/44 |
| 2015/0380788 | A1 * | 12/2015 | Kazuno | H01M 16/006 429/9 |
| 2016/0344281 | A1 | 11/2016 | Choudhury | |
| 2018/0218862 | A1 * | 8/2018 | Matsuo | H01H 47/223 |
| 2019/0165685 | A1 * | 5/2019 | Lind | H02M 3/33523 |

OTHER PUBLICATIONS

Tran, P., et al.; "Using Input Condition Monitoring to Improve the Stability of Digitally Controlled Power Factor Correcting Converters"; 2010 IEEE 12th Workshop on Control and Modeling for Power Electronics; Jun. 28, 2010; 6 pages.

* cited by examiner

*Primary Examiner* — Jeffrey A Gblende
(74) *Attorney, Agent, or Firm* — Keating & Bennett, LLP (57) ABSTRACT

A method for controlling a power factor correction circuit includes detecting a stability degree of an input voltage of the power factor correction circuit, wherein the stability degree is at least one of a frequency or an amplitude deviation of the input voltage from a predetermined trend, adjusting a current control parameter of PID or PI according to the stability degree of the input voltage of the power factor correction circuit, and controlling at least one of a voltage loop and a current loop using the adjusted control parameter of the PID or the PI to adjust a control signal of the at least one switching circuit.

19 Claims, 7 Drawing Sheets

METHOD FOR CONTROLLING POWER FACTOR CORRECTION CIRCUIT, CONTROLLER AND SYSTEM

CROSS REFERENCE TO RELATED APPLICATIONS

This application claims the benefit of priority to Chinese Patent Application No. 201810038232.4 filed on Jan. 15, 2018. The entire contents of this application are hereby incorporated herein by reference.

BACKGROUND OF THE INVENTION

1. Field of the Invention

The present invention relates to a method for controlling a power factor correction circuit, a controller for the power factor correction circuit, and a system for the power factor correction circuit.

2. Description of the Related Art

A power factor is a parameter for measuring a power efficiency of an electrical device, and a low power factor represents a low power efficiency. In electrical engineering, a power factor of an alternating current power system is defined as a ratio of an active power flowing into a load to an apparent power in a circuit, and it is a dimensionless number in the closed interval from −1 to 1. A power factor less than 1 means that a voltage waveform and a current waveform are out of phase, thus reducing an instantaneous product of the two waveforms. Actual power consumption is an ability of a circuit to execute operations at a specific time point. Apparent power is a product of a current and a voltage in the circuit. Since the energy is stored in the load and returned to a power supply, or the non-linear load distorts the waveform of the current drawn from the power supply, the apparent power is greater than the actual power. When a device (usually a load) generates power, a negative power factor is generated and flows to a generator which is generally regarded as a power supply. In an electrical power system, a load with a low power factor absorbs more current while transmitting a same useful power compared with a load with a high power factor. Higher currents increase energy losses in a power distribution system and require larger wires and other equipment. Due to the high cost of equipment and wasted energy, power companies typically charge higher costs to industrial or commercial customers with lower power factors.

Power Factor Correction (PFC) is a technique to increase the power factor of the electrical device. Linear loads (e.g., induction motors) with low power factors may be corrected through a passive capacitor or an inductive network. A nonlinear load (e.g., a rectifier) may distort the current drawn from the system. In this case, active or passive power factor correction may be configured to cancel distortion and increase the power factor. The device used to correct the power factor may be disposed in a central substation, distributed in a power distribution system, or provided in power consuming equipment.

However, current nonlinear PID (proportion, integral, differential) control is only able to handle a small range of input voltages and impedances. When an input voltage of the AC (alternating current) power source is high or the impedance range is wide, it is easy to cause an oscillation to the input current and the input voltage.

At present, there are complex equations to calculate the control parameters, and the calculated control parameters are configured to control a PFC circuit. These methods may solve most of the related oscillation problems. However, the problems of serious harmonic distortion and insufficient phase margin of the input current still remain unsolved.

SUMMARY OF THE INVENTION

Preferred embodiments of the present invention provide methods to reduce an oscillation and a harmonic distortion of an input current.

A preferred embodiment of the present invention provides a method for controlling a power factor correction circuit, wherein the power factor correction circuit includes a rectification circuit and at least one switching circuit, wherein the at least one switching circuit adjusts a current in the power factor correction circuit, and the method includes detecting a stability degree of an input voltage of the power factor correction circuit, wherein the stability degree is at least one of a frequency or an amplitude deviation of the input voltage from a predetermined trend; adjusting a current control parameter of PID (proportion, integral, differential) or PI (proportion, integral) according to the stability degree of the input voltage of the power factor correction circuit, wherein the control parameter of the PID or the PI includes one or more of a proportional coefficient, an integral coefficient, and a differential coefficient; and controlling at least one of a voltage loop or a current loop using the adjusted control parameter of the PID or the PI to adjust a control signal of the at least one switching circuit, wherein the adjusted control parameter of the PID or the PI maintains the power factor correction circuit at a predetermined stability degree.

In a preferred embodiment of the present invention, the detecting of a stability degree of an input voltage of the power factor correction circuit includes sampling the input voltage of the power factor correction circuit; calculating a number of times of the input voltage deviating from the predetermined trend by a predetermined value within a predetermined duration; and determining a stability degree of the input voltage of the power factor correction circuit according to the number of times of the input voltage deviating from the predetermined trend by the predetermined value within the predetermined duration.

In a preferred embodiment of the present invention, sampling points for sampling the input voltage of the power factor correction circuit are set to a line that directly or indirectly reflects an alternating voltage change at an input end.

In a preferred embodiment of the present invention, the adjusting of a current control parameter of PID or PI according to the stability degree of the input voltage of the power factor correction circuit includes decreasing the control parameter of the PID or the PI when the number of times of the input voltage deviating from the predetermined trend by the predetermined value is greater than a first predetermined number threshold within the predetermined duration.

In a preferred embodiment of the present invention, the adjusting of a current control parameter of PID or PI according to the stability degree of the input voltage of the power factor correction circuit includes increasing the control parameter of the PID or the PI when the number of times of the input voltage deviating from the predetermined trend by the predetermined value is less than a second predetermined number threshold within the predetermined duration, wherein the second predetermined number threshold is less than the first predetermined number threshold.

In a preferred embodiment of the present invention, the method further includes, when the current control parameter of the PID exceeds a predetermined control parameter threshold range of the PID, restricting the current control parameter of the current PID to the control parameter threshold range of the PID.

In a preferred embodiment of the present invention, the detecting of a stability degree of the input voltage of the power factor correction circuit is performed according to a predetermined frequency.

A preferred embodiment of the present invention provides a controller for a power factor correction circuit, including a stability detecting circuit that detects a stability degree of an input voltage of the power factor correction circuit, wherein the stability degree is at least one of a frequency or an amplitude deviation of the input voltage from a predetermined trend; a parameter adjusting circuit that adjusts a current control parameter of PID or PI according to the stability degree of the input voltage of the power factor correction circuit, wherein the control parameter of the PID or the PI includes one or more of a proportional coefficient, an integral coefficient, and a differential coefficient; and a control circuit that controls at least one of a voltage loop or a current loop using the adjusted control parameter of the PID or the PI to adjust a control signal of the at least one switching circuit, wherein the adjusted control parameter of the PID or the PI maintains the power factor correction circuit at a predetermined stability degree.

In a preferred embodiment of the present invention, the control parameter of the PID includes at least one of a proportional gain parameter and an integral gain parameter.

In a preferred embodiment of the present invention, the control parameter of the PID includes at least one of a proportional gain parameter, an integral gain parameter and a differential gain parameter.

In a preferred embodiment of the present invention, the controller further includes a current loop, wherein the control circuit controls the current loop to adjust a control signal of the at least one switching circuit in the power factor correction circuit by using the adjusted control parameter of the PID or the PI.

In a preferred embodiment of the present invention, the controller further includes a current loop and a voltage loop, wherein the control circuit controls the current loop to adjust a control signal of the at least one switching circuit in the power factor correction circuit by using the adjusted control parameter of the PID or the PI.

A preferred embodiment of the present invention provides a system for a power factor correction circuit, including a controller for the power factor correction circuit, a power factor correction circuit, a power supply and a load, wherein the power factor correction circuit corrects a power factor of the power supply; the power supply is coupled to an input end of the power factor correction circuit; and the load is coupled to an output end of the power factor correction circuit.

Preferred embodiments of the present invention provide the following advantages and benefits.

In preferred embodiments of present invention, without knowledge of an impedance value of the AC power supply, by detecting a stability degree of the input voltage of the power factor correction circuit, an impedance change of the AC power source is able to be estimated. According to the stability degree of the input voltage of the power factor correction circuit, a current control parameter of the PID or the PI is adjusted correspondingly, and a control signal of at least one switching circuit is adjusted by using the adjusted control parameter of the PID or the PI to improve the stability degree of the power factor correction circuit, which reduces the oscillation and the harmonic distortion of the input current.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
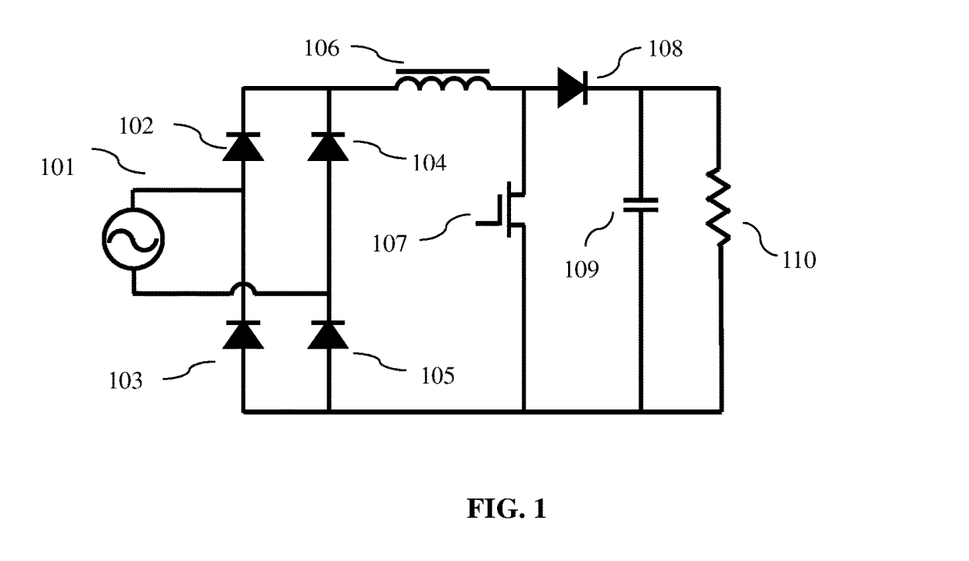
FIG. 1 schematically illustrates a structural diagram of an ideal PFC circuit in the prior art.

For facilitating explanation and understanding, FIG. 1 schematically illustrates a structural diagram of an ideal PFC circuit in the prior art. The PFC circuit operates in a continuous conduction mode with a fixed switching frequency, and the PFC circuit is already used in an AC-DC (Alternating Current Direct Current) power supply for many years to reduce a harmonic distortion of a current and increase a power factor in a single-phase power system.

As shown in FIG. 1, 101 is an ideal AC voltage source that powers the entire PFC circuit with a small internal impedance. 102, 103, 104, and 105 are power diodes respectively, and the four power diodes define a diode rectifier bridge that rectifies an input alternating current (AC) to a direct current (DC). 106 is an inductor that stores electrical energy. 107 is an electrical switch and the inductor 106 is able to be charged when the electrical switch 107 is turned off. When the electrical switch 107 is turned on, a current from the inductor 106 is released and flows through a diode 108 to charge a capacitor 109. The capacitor 109 defines and functions as a buffer to filter ripples flowing to a load 110.

It should be noted that generally all PFC circuits must include at least one switch to adjust the current waveform. Therefore, some PFC circuits include the switch on the rectifier bridge.

Figure 2:
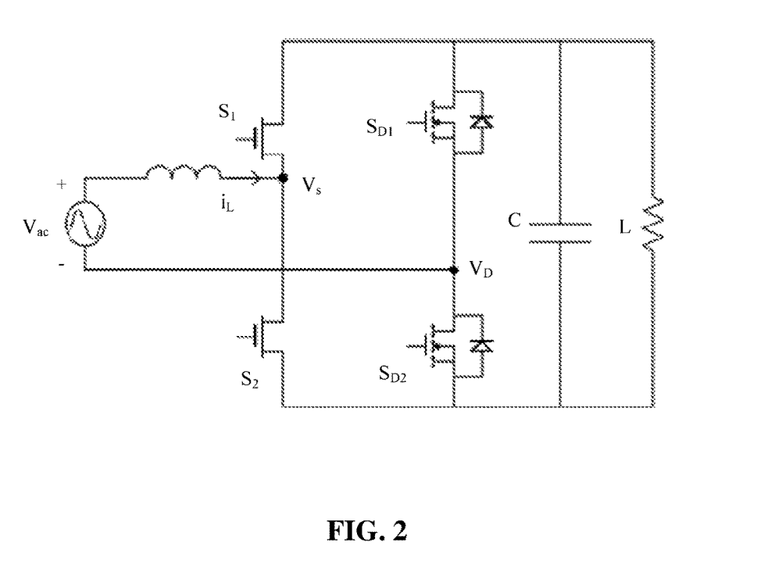
FIG. 2 schematically illustrates a structural diagram of an ideal PFC circuit in the prior art.

For convenience of explanation, FIG. 2 schematically illustrates a structural diagram of an ideal PFC circuit in the prior art. As shown in FIG. 2, an inductance L is the same as the inductor 106 in FIG. 1, and a capacitance C is the same as the capacitor 109 in FIG. 1. Field effect transistors $S_{D1}$ and $S_{D2}$ are used as rectifiers, similar to the power diodes 102~105 in FIG. 1, but have a different operating mechanism. A voltage of a power supply Vac is the same as a voltage between the ideal AC voltage source 101 and the power diode 105. In FIG. 2, field effect transistors $S_{D1}$ and $S_{D2}$ are rectification switches, and $S_1$ and $S_2$ control the current, so that a voltage at $V_S$ may be taken as a sampling voltage for loop control.

Figure 3:
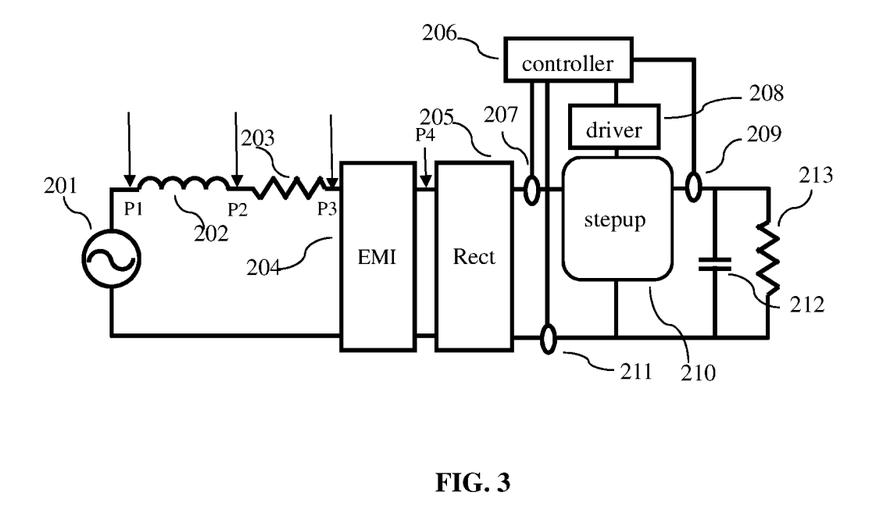
FIG. 3 schematically illustrates a structural diagram of an equivalent circuit of an actual PFC circuit in the prior art.

Correspondingly, FIG. 3 schematically illustrates a structural diagram of an equivalent circuit of an actual PFC circuit with a digital control function.

As shown in FIG. 3, 201 represents an ideal AC voltage source, but any AC power system is not an ideal AC voltage source because it always has an impedance before it is coupled to an electrical product. When a length of the connecting line becomes longer or the electrical product is supplied through an isolation transformer, a resistor 203 with a high resistance and an inductor 202 may cause a high impedance and energy loss. Since the inductor 202 and the resistor 203 are connected in series, the input current becomes high, which causes the voltage to drop in front of a rectifier 205. Since a boost circuit 210 may generate switching noise and a power electronic switch 107 (e.g., GaN FET, MOSFET, IGBT, BJT) in 210 has a fast switching action, an EMI (Electromagnetic Interference) 204 is an equivalent low pass filter to prevent electromagnetic interference from other electrical devices that share the same AC power.

205 is a rectification circuit, such as a conventional diode bridge or a synchronous rectifier including an electrical switch that rectifies the input AC to DC. 210 is a boost power conversion circuit, in parallel with a load 110 or a load 213, that draws a synchronous sinusoidal current from the input voltage source 201 through 202, 203, 204, and 205 to maintain a constant voltage at a snubber capacitor 109 or a snubber capacitor 212. The actions described above are all performed by a digital controller 206 through complex calculations and algorithms. By detecting an input voltage 207 before or after rectification, an input current 211, an output voltage 209, and a driver 206 amplify a Pulse Width Modulation (PWM) signal input from the digital controller 206, and output to the electrical switch 107.

Due to some high requirements for standard iTHD (Total Harmonic Distortion) or the power factor, a current loop filter requires a large number of PID gain parameters to achieve a better sinusoidal input current. However, in a case in which the impedance of the AC power source is low, the existing design works well, and the input current and the input voltage may have the same or substantially the same waveform. However, for high impedance AC power supplies with the same current loop filter gain, an oscillating input current waveform is generated. And in some more serious cases, not only the current waveform oscillates, but also a waveform of the input voltage oscillates.

In summary, the input current of the current PFC circuit still has a severe harmonic distortion, and an insufficient phase margin.

In preferred embodiments of present invention, based on a premise that an impedance value of the AC power supply is unknown, by detecting a stability degree of the input voltage of the power factor correction circuit, an impedance change of the AC power source is able to be estimated. Therefore, according to the stability degree of the input voltage of the power factor correction circuit, a current control parameter of the PID or the PI is adjusted correspondingly, and a control signal of the at least one switching circuit is adjusted by using the adjusted control parameter of the PID or the PI to improve the stability degree of the power factor correction circuit, which reduces the oscillation and the harmonic distortion of the input current.

Preferred embodiments of the present invention are described in detail below with reference to the drawings.

Figure 4:
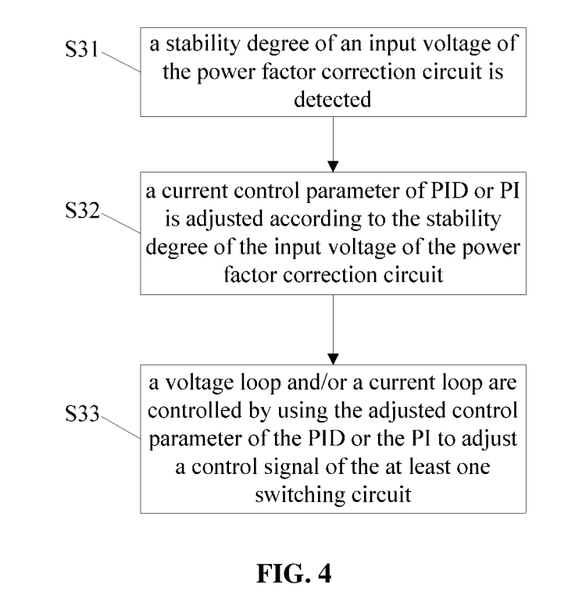
FIG. 4 schematically illustrates a flow diagram of a method for controlling a power factor correction circuit according to a preferred embodiment of the present invention.

In a preferred embodiment of the present invention, a power factor correction (PFC) circuit includes a rectification circuit and at least one switching circuit, wherein the at least one switch circuit adjusts a current in the power factor correction circuit. Correspondingly, FIG. 4 schematically illustrates a flow diagram of a method for controlling a power factor correction circuit according to a preferred embodiment of the present invention. Referring to FIG. 4, the method is described in detail in steps.

S31: a stability degree of an input voltage of the power factor correction circuit is detected.

It should be noted that, due to factors such as changes in an input impedance of a power supply, an input voltage of the PFC circuit is not an ideal sine wave, and a certain fluctuation or oscillation occurs. In other words, the input voltage has a low stability degree.

In a preferred embodiment of the present invention, the stability degree may have a positive correlation with a frequency and/or an amplitude deviation of the input voltage from a predetermined trend.

Figure 5:
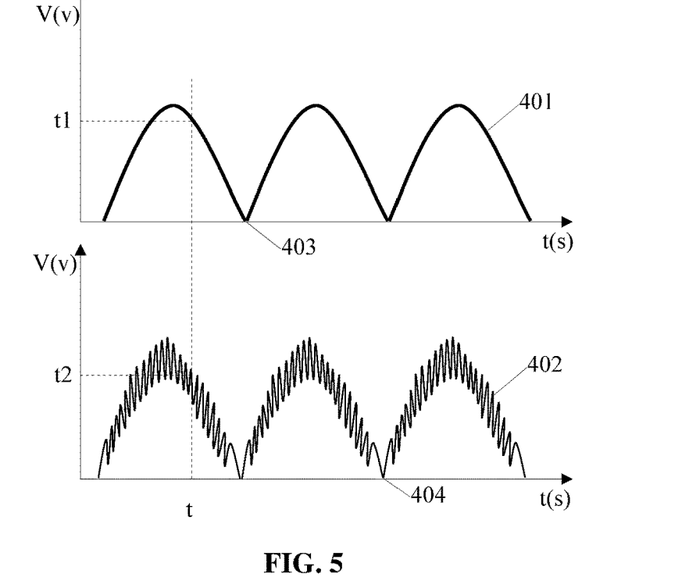
FIG. 5 schematically illustrates a waveform diagram of an ideal input voltage and a corresponding oscillating input voltage according to a preferred embodiment of the present invention.

For example, FIG. 5 schematically illustrates a waveform diagram of an ideal input voltage and a corresponding oscillating input voltage according to a preferred embodiment of the present invention. A horizontal axis represents time t(s), and a vertical axis represents voltage V(v). 401 shows an ideal input voltage waveform, that is, a waveform for the input voltage conforming to the predetermined trend. 402 shows an oscillating input voltage waveform, that is, a waveform for the input voltage deviating from the predetermined trend, and 403 and 404 represent zero crossing points. Specifically, at time t, an instantaneous value of the input voltage conforming to the predetermined trend is v1, and the instantaneous value of the input voltage deviating from the predetermined trend is v2, v1 is predetermined, and an amplitude of the input voltage deviating from the predetermined trend is |v1-v2|.

In a preferred embodiment of the present invention, for ease of implementation, a process of detecting the stability degree of the input voltage of the power factor correction circuit is performed according to a predetermined frequency, and the predetermined frequency may be a fixed value or a value that changes according to a predetermined rule.

In a preferred embodiment of the present invention, in order to save resources, the process of detecting the stability degree of the input voltage of the power factor correction circuit is performed when a predetermined condition is satisfied. Those skilled in the art may set the predetermined condition according to actual needs, for example, the stability degree of the input voltage of the power factor correction circuit that is detected last time is less than a predetermined threshold of the stability degree.

S32: a current control parameter of PID or PI is adjusted according to the stability degree of the input voltage of the power factor correction circuit.

It should be noted that, because the actual application is complicated and includes many uncontrollable factors, an impedance of the power supply is not able to be directly obtained. However, as described above, if an impedance variation of the power supply is wide, the input voltage of the PFC circuit is oscillated correspondingly. Therefore, by detecting the stability degree of the input voltage of the PFC circuit, the impedance variation of the power supply corresponding thereto is able to be obtained.

Moreover, in a preferred embodiment of the present invention, a corresponding mapping relationship between the current loop control parameter and the stability degree of the input voltage of the PFC circuit may be obtained through experiments. Therefore, according to the stability degree of the PFC circuit, the control parameter of a loop control circuit currently used (i.e., the control parameter of the PID or the PI) is able to be adjusted, and the adjusted PID or PI control parameters are obtained.

Specifically, the control parameter of the PID or the PI includes one or more of a proportional coefficient, an integral coefficient, and a differential coefficient. The control parameter may be set to other types by those skilled in the art according to actual needs.

S33: a voltage loop and/or a current loop are controlled by using the adjusted control parameter of the PID or the PI to adjust a control signal of the at least one switching circuit.

In a preferred embodiment of the present invention, according to a structural setting of the current PFC circuit, the voltage loop and/or the current loop are controlled by using the adjusted control parameter of the PID or the PI, to provide adjustment of the control signal of the at least one switch circuit.

In a preferred embodiment of the present invention, the adjusted control parameter of the PID or the PI may be set to maintain the power factor correction circuit at a predetermined stability degree, which improves the stability degree of the power factor correction circuit and reduces the oscillation and the harmonic distortion of the input current.

It should be noted that, in some preferred embodiments of the present invention, a plurality of methods may be used to detect the stability degree of the input voltage of the power factor correction circuit. For example, the input voltage of the power factor correction circuit may be sampled, and a number of times of the input voltage deviating from the predetermined trend by a predetermined value within a predetermined duration may be calculated. Further, according to the number of times of the input voltage deviating from the predetermined trend by the predetermined value within the predetermined duration, the stability degree of the input voltage of the power factor correction circuit is determined.

In some preferred embodiments of the present invention, sampling points to sample the input voltage of the power factor correction circuit are set to a line that directly or indirectly reflects an alternating voltage change at an input end, to improve sampling accuracy.

In particular, the line that directly or indirectly reflects the change in the alternating voltage change at the input end may include a live wire. Moreover, it should be noted that the live wire may be used as a bus bar in some cases, and the live wire is a position that is not filtered by a capacitor parallel to an output end and directly or indirectly reflects the change in the alternating voltage change at the input end. Specifically, a voltage waveform that is not rectified by the rectification circuit is a sinusoidal alternating voltage, and after rectification, the sinusoidal alternating voltage is converted into a continuous forward half-wave (known as a skull-shaped wave). Positions and lines that are able to detect the two types of the input voltage waveform may be used as sampling points of the voltage. Therefore, sampling is performed on the live line (or bus), a line used as the bus bar, and/or the input end and the output end of the rectification circuit.

Referring to FIG. 3, points P1, P2, P3 and P4 may be used as sampling points.

Figure 6:
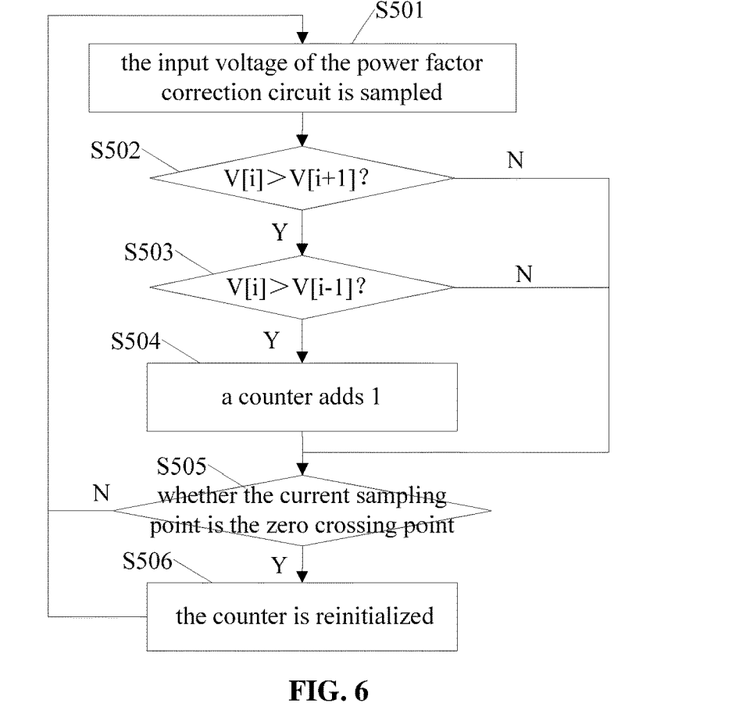
FIG. 6 schematically illustrates a flow diagram of a method for detecting a stability degree of the input voltage of a power factor correction circuit according to a preferred embodiment of the present invention.
Figure 7:
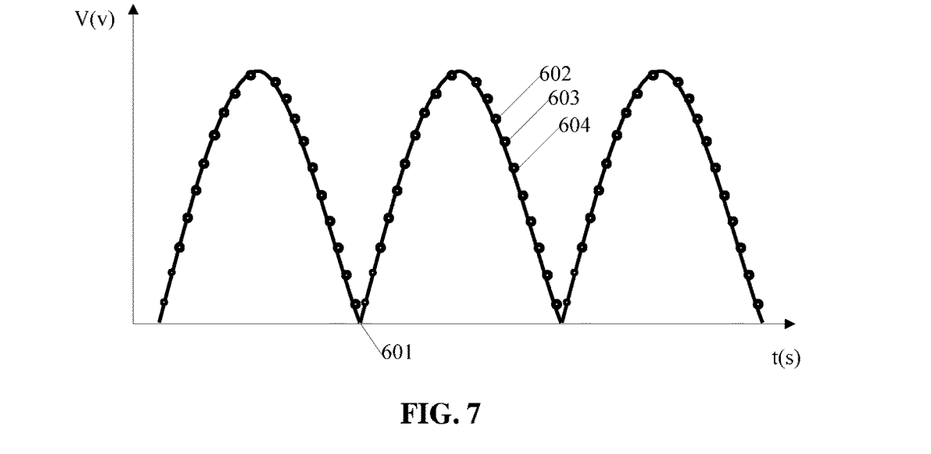
FIG. 7 schematically illustrates a waveform diagram of an input voltage according to a preferred embodiment of the present invention.

For ease of explanation and understanding of a method for detecting the stability degree of the input voltage of the power factor correction circuit, FIG. 6 schematically illustrates a flow diagram of a method for detecting stability degree of the input voltage of a power factor correction circuit according to a preferred embodiment of the present invention. Correspondingly, FIG. 7 schematically illustrates a waveform diagram of an input voltage according to a preferred embodiment of the present invention. A horizontal axis represents time t(s), a vertical axis represents the voltage V(v), and 601 represents a zero crossing point. Referring to FIG. 6 and FIG. 7, the method of detecting the stability degree of the input voltage of the power factor correction circuit may include following steps.

S501: the input voltage of the power factor correction circuit is sampled.

For example, for a voltage waveform 60 shown in FIG. 7, sampling points such as 603 may be selected and the sampling may be performed at predetermined time intervals. Moreover, if a current sampling point 603 is defined as a sampling point for the i-th sampling, a sampling of a sampling point 604 adjacent to the sampling point 603 is defined as the (i+1)-th sampling, and a sampling of a sampling point 604 adjacent to the sampling point 602 is defined as the (i−1)-th sampling.

S502: it is determined whether V[i] is greater than V[i+1].

In a preferred embodiment of the present invention, V[i] represents a voltage obtained by the i-th sampling, and V[i+1] represents a voltage obtained by the (i+1)-th sampling. For any i-th samplings, it is determined whether the voltage V[i] obtained by the current sampling is greater than the voltage V[i+1] sampled by the next sampling point.

If V[i] is greater than V[i+1], S503 is performed; otherwise, S505 is performed.

S503: it is determined whether V[i] is greater than V[i−1].

In a preferred embodiment of the present invention, for any i-th sampling, when it is determined that the voltage V[i] obtained by the current sampling is greater than the voltage V[i+1] sampled by the next sampling point, it is determined that the voltage V[i] obtained by the current sampling is greater than the voltage V[i−1] sampled by the previous sampling point. Therefore, in combination with S502 and S503, it is determined whether a waveform at the current sampling point 603 is a waveform bulge, that is, whether it is a deviation.

If V[i+1] is greater than V[i+2], S504 is performed; otherwise, S505 is performed.

S504: a counter adds 1.

In a preferred embodiment of the present invention, the counter is a counter for a number of deviations, the initial value is zero, and the counter counts the waveform bulge, that is, counts the number of deviations.

S505: it is determined whether the current sampling point is the zero crossing point.

In a preferred embodiment of the present invention, an instantaneous value of the voltage at the zero crossing point is zero. Accordingly, it is able to be determined whether the current i-th sampling point is the zero crossing point by comparing a voltage of the current sampling point with a voltage of the zero crossing point. Moreover, a waveform between two adjacent zero crossing points is a half-wave, and a corresponding duration is a half period. Therefore, the predetermined duration is a half period, and those skilled in the art may set the predetermined duration to other values according to actual needs.

If the current sampling point is the zero crossing point, S506 is performed; otherwise, S501 is performed.

S506: the counter is reinitialized.

In a preferred embodiment of the present invention, when the current sampling point is the zero crossing point, which means the predetermined duration has expired, the calculator is reinitialized, the current number of deviations is cleared, and S501 is performed again to start a next loop. When the current sampling point is not the zero crossing point, which means the predetermined duration has not yet expired, sampling is continued to calculate the total number of deviations in the predetermined duration, and therefore, S501 continues to be performed.

In order to improve the stability degree of the output current, in a preferred embodiment of the present invention, the current control parameter of the PID or the PI that is adjusted according to the stability degree of the input voltage of the power factor correction circuit may include increasing the control parameter of the PID or the PI when the number of times of the input voltage deviating from the predetermined trend by the predetermined value is less than a second predetermined number threshold within the predetermined duration, wherein the second predetermined number threshold is less than the first predetermined number threshold.

In a preferred embodiment of the present invention, the current control parameter of the PID or the PI that is adjusted according to the stability degree of the input voltage of the power factor correction circuit may include increasing the control parameter of the PID or the PI when the number of times of the input voltage deviating from the predetermined trend by the predetermined value is greater than a first predetermined number threshold within the predetermined duration, which reduces an oscillation degree of the output current.

An excessive adjustment may cause the power factor control circuit to not work properly. In order to avoid this case, in a preferred embodiment of the present invention, when the current control parameter of the PID exceeds a predetermined control parameter threshold range of the PID, the current control parameter of the current PID is restricted to the control parameter threshold range of the PID.

Figure 8:
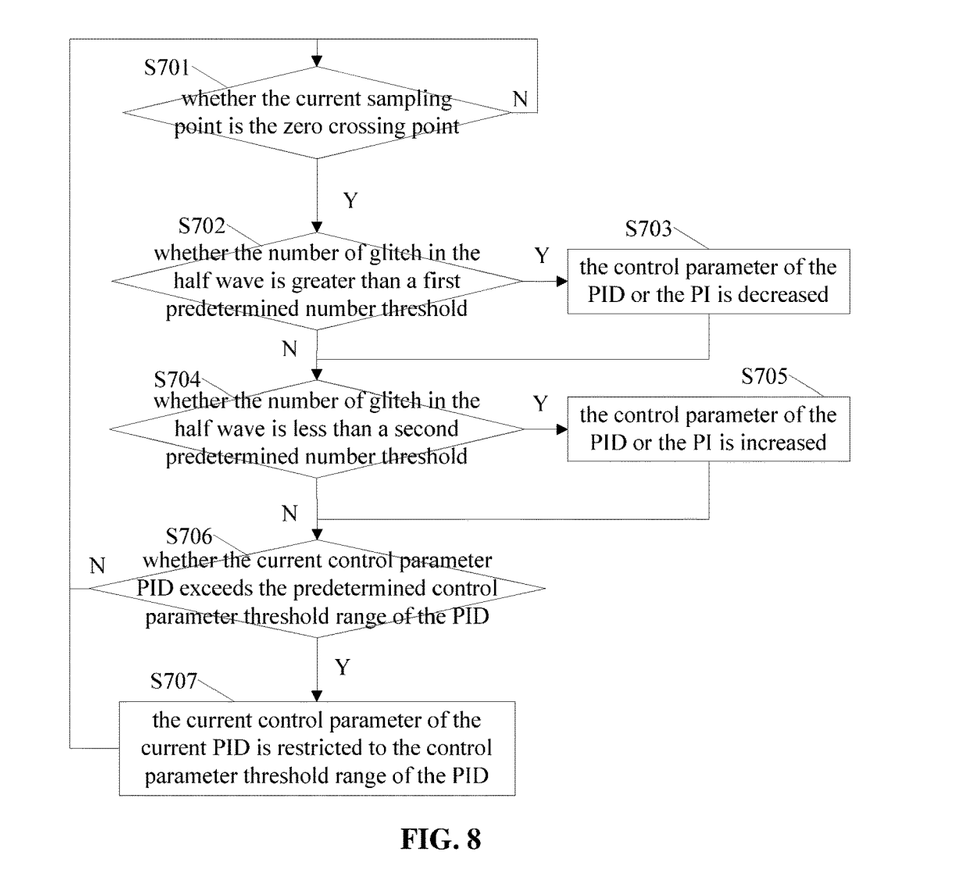
FIG. 8 schematically illustrates a flow diagram of a method for controlling a loop with adjusted control parameters of the PID or the PI according to a preferred embodiment of the present invention.

FIG. 8 schematically illustrates a flow diagram of a method for controlling a loop with adjusted control parameters of the PID or the PI according to a preferred embodiment of the present invention. As shown in FIG. 8, the adjustment process may be performed as follows.

S701: it is determined whether the current sampling point is the zero crossing point.

Similar to S505, the instantaneous value of the voltage at the zero crossing point is zero. Therefore, it is determined whether the current i-th sampling point is the zero crossing point by comparing the voltage of the current sampling point with the voltage of the zero crossing point. Moreover, a waveform between two adjacent zero crossing points is a half-wave, and the corresponding duration is a half period. Therefore, the predetermined duration is a half period, and those skilled in the art may set the predetermined duration to other values according to actual needs.

If the current sampling point is the zero crossing point, S702 is performed; otherwise, S701 is repeated.

S702: it is determined whether the number of deviations in the half wave is greater than a first predetermined number threshold.

In order to adjust the output current in time to improve the stability, in a preferred embodiment of the present invention, it is determined whether the number of deviations in the half wave is greater than a first predetermined number threshold. When the number of deviations in the half wave is greater than the first predetermined number threshold, S703 may be performed; otherwise, S704 may be performed.

S703: the control parameter of the PID or the PI is decreased.

In a preferred embodiment of the present invention, after the control parameter of the PID or the PI is decreased, S704 may be performed.

S704: it is determined whether the number of deviations in the half wave is less than a second predetermined number threshold.

It should be noted that the second predetermined number threshold is less than the first predetermined number threshold. In a preferred embodiment of the present invention, in order to avoid a low operating performance of the power factor amplifying circuit caused by the number of deviations in the half wave being too small, it is continued to determine whether the number of deviations in the half wave is less than a second predetermined number threshold. When the number of deviations in the half wave is less than the second predetermined number threshold, S705 is performed; otherwise, S706 is performed.

S705: the control parameter of the PID or the PI is increased.

In a preferred embodiment of the present invention, in order to improve the stability of the output current, the control parameter of the PID or the PI may be correspondingly increased when the number of deviations in the half wave is less than the second predetermined number threshold. After the current control parameter of the PID or the PI is increased, step S706 may be further performed.

S706: it is determined whether the current control parameter PID exceeds the predetermined control parameter threshold range of the PID.

If it is determined that the current control parameter PID exceeds the predetermined control parameter threshold range of the PID, S707 is performed; otherwise, S701 may be continued to start a next cycle for adjustment.

S707: the current control parameter of the current PID is restricted to the control parameter threshold range of the PID.

In a preferred embodiment of the present invention, the current control parameter of the current PID may be restricted to the control parameter threshold range of the PID, which improves performance of the power factor correction circuit.

Figure 9:
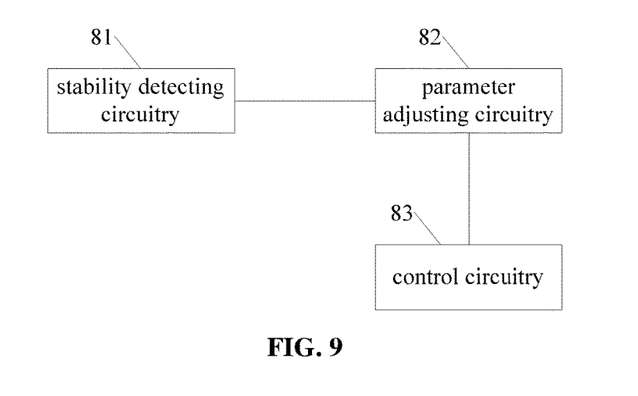
FIG. 9 schematically illustrates a structural diagram of a controller of a power factor correction circuit according to a preferred embodiment of the present invention.

FIG. 9 schematically illustrates a structural diagram of a controller of a power factor correction circuit according to a preferred embodiment of the present invention. As shown in FIG. 9, the controller includes a stability detecting circuit 81, a parameter adjusting circuit 82 and a control circuit 83.

The stability detecting circuit 81 detects the stability degree of the input voltage of the power factor correction circuit. Moreover, the stability degree may preferably be a frequency and/or an amplitude of the input voltage deviating from the predetermined trend.

The parameter adjusting circuit 82 adjusts the current control parameter of the PID or the PI according to the stability degree of the input voltage of the power factor correction circuit, wherein the control parameter of the PID or the PI may preferably include one or more of a proportional coefficient, an integral coefficient, and a differential coefficient.

The control circuit 83 controls a voltage loop and/or a current loop using the adjusted control parameter of the PID or the PI to adjust a control signal of the at least one switching circuit. Moreover, the adjusted control parameter of the PID or the PI maintains the power factor correction circuit at a predetermined stability degree, which is able to avoid the oscillation of the power factor correction circuit due to large variations in the input impedance of the current source.

It should be noted that, according to different structures of a feedback circuit used by the power factor correction circuit, control parameters adjusted by the control circuitry 83 are also different. For example, when the feedback circuit used by the power factor correction circuit is a PID circuit, the control circuit 83 may adjust three control parameters corresponding to the PID. As another example, if the feedback circuit used by the power factor correction circuit is a PI circuit, the control circuit 83 may adjust two control parameters corresponding to the PI.

Different control parameters have different sensitivity and adjustment effects. Specifically, the proportional gain parameter and the integral gain parameter are relatively easily adjusted, and have minor side effects. Therefore, in order to improve the adjustment effect, the control parameter of the PID may include at least one of a proportional gain parameter and an integral gain parameter. In other words, the control circuit 83 may only adjust the proportional gain parameter and/or the integral gain parameter without adjusting the differential gain parameter.

In a preferred embodiment of the present invention, the control parameter of the PID may preferably include at least one of a proportional gain parameter, an integral gain parameter and a differential gain parameter. In other words, the control circuit may simultaneously adjust the three control parameters corresponding thereto, so that comprehensiveness of the adjustment is able to be improved.

It should be noted that structures of the controller may be different according to the loop setting, and correspondingly, the adjusted objects may also be different. In a preferred embodiment of the present invention, in order to accurately control a cyclic feedback of the current, the controller of the power factor correction circuit may preferably further include a current loop, and the control circuit 83 may control the current loop to adjust a control signal of the at least one switching circuit in the power factor correction circuit by using the adjusted control parameter of the PID or the PI.

Figure 10:
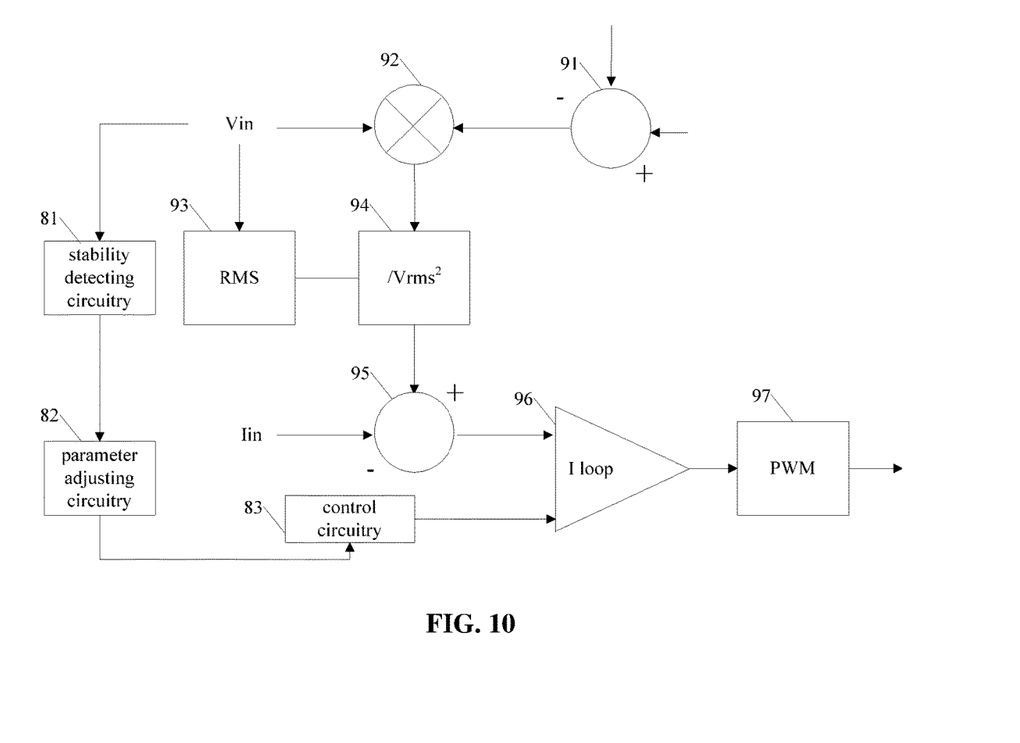
FIG. 10 schematically illustrates a structural diagram of a controller of a power factor correction circuit according to a preferred embodiment of the present invention.

FIG. 10 schematically illustrates a structural diagram of a controller of a power factor correction circuit according to a preferred embodiment of the present invention. As shown in FIG. 10, the controller includes a first comparator 91, a reference current generation circuit, a second comparator 95, a current PID loop 96, a pulse width modulator 97, the stability detecting circuit 81, the parameter adjusting circuit 82, and the control circuit 83.

The first comparator 91 compares a target output voltage with a current output voltage and obtains a first comparison result.

The reference current generation circuit receives a current input voltage and the first comparison result, generates a reference current, and outputs the reference current to the second comparator 95.

The second comparator 95 compares the input current with the reference current, and outputs the second comparison result obtained after the comparison to the current PID loop 96.

The stability detecting circuit 81 detects the stability degree of the input voltage of the power factor correction circuit. Moreover, the stability degree may preferably be the frequency and/or the amplitude of the input voltage deviating from the predetermined trend.

The parameter adjusting circuit 82 adjusts the current control parameter of the current PID according to the stability degree of the input voltage of the power factor correction circuit, wherein the control parameter may preferably include one or more of a proportional coefficient, an integral coefficient, and a differential coefficient.

The control circuit 83 controls the current PID loop 96 by using the adjusted control parameter of the PID to adjust the control signal of the at least one switching circuit, wherein the adjusted control parameter of the PID maintains the power factor correction circuit at a predetermined stability degree.

The current PID loop 96 receives the second comparison result and the adjusted control parameter of the PID, adjusts the second comparison result according to the adjusted control parameter of the PID, and outputs the second adjusted comparison result. The pulse width modulator 97 (PWM) performs a pulse width modulation on the second adjusted comparison result and outputs the second modulated comparison result as a control signal to the at least one switching circuit of the power factor correction circuit.

In a preferred embodiment of the present invention, the current PID loop 96 adjusts an input current waveform by receiving a feedback error from the second comparator 95, to calculate duty cycle output from a driver of the pulse width modulator 97 to the power factor correction circuit. Referring to FIG. 3, the driver may be 208.

In a preferred embodiment of the present invention, the reference current generating circuit includes a mixer 92, a mean square error calculating circuit 93, and a squaring circuit 94, wherein the mixer 92 mixes the current input voltage and the first comparison result, the mean square error calculation circuit 93 calculates a mean square error of the current input voltage, and the input voltage and the mean square error RMS satisfy the following relationship.

$$RMS = \sqrt{\frac{2}{T}\int_0^{T/2} Vin(t)^2 dt}$$

T is a period of the voltage waveform. The squaring circuit 94 receives a result output from the mixer 92 and the mean square error RMS, generates the reference current, and outputs to the second comparator 95.

In a preferred embodiment of the present invention, in order to accurately control a cyclic feedback of the voltage, the controller of the power factor correction circuit may preferably further include a voltage loop, wherein the control circuit 83 controls the current loop to adjust a control signal of the at least one switching circuit in the power factor correction circuit by using the adjusted control parameter of the PID or the PI, which facilitates the circuit adjustment.

Figure 11:
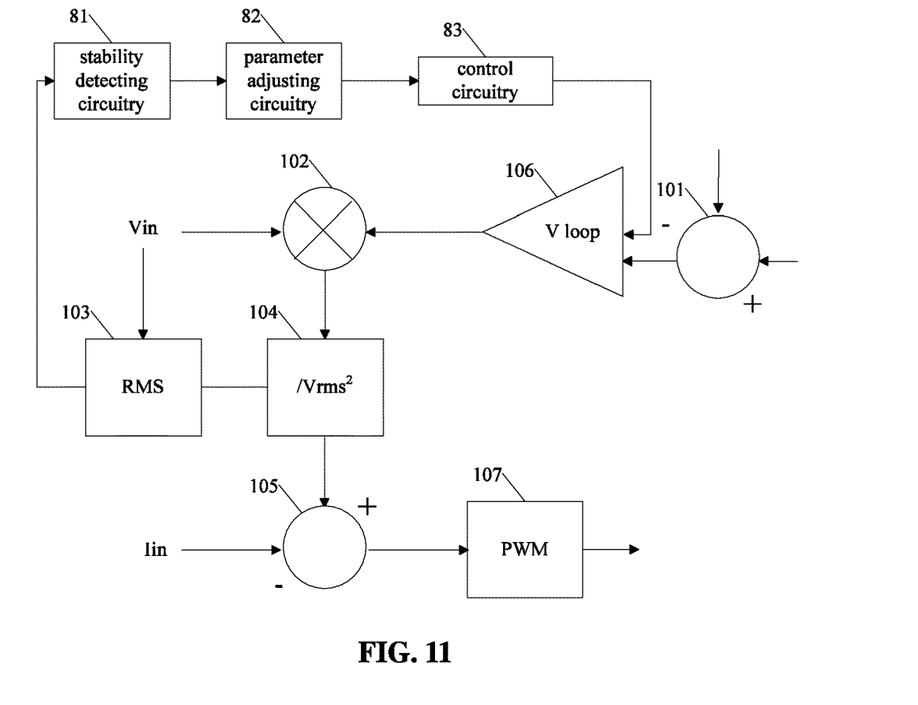
FIG. 11 schematically illustrates a structural diagram of a controller of a power factor correction circuit according to a preferred embodiment of the present invention.

FIG. 11 schematically illustrates a structural diagram of a controller of a power factor correction circuit according to a preferred embodiment of the present invention. As shown in FIG. 11, the controller includes a first comparator 101, a voltage PID loop 106, a reference current generation circuit, a second comparator 105, a pulse width modulator 107, the stability detecting circuit 81, the parameter adjusting circuit 82, and control circuit 83.

The first comparator 101 compares a target output voltage with a current output voltage, obtains a third comparison result, and outputs the third comparison result to the voltage PID loop 106.

The stability detecting circuit 81 receives the current input voltage, and detects the stability degree of the input voltage of the power factor correction circuit.

The parameter adjusting circuit 82 adjusts the current control parameter of the current PID according to the stability degree of the current input voltage, wherein the control parameter may preferably include one or more of a proportional coefficient, an integral coefficient, and a differential coefficient.

The control circuit 83 controls the current PID loop 106 by using the adjusted control parameter of the PID to adjust the control signal of the at least one switching circuit, wherein the adjusted control parameter of the PID maintains the power factor correction circuit at a predetermined stability degree.

The voltage PID loop 106 receives the third comparison result and the adjusted control parameter of the PID, and adjusts the third comparison result according to the adjusted control parameter of the PID.

The reference current generating circuit receives the current input voltage and the third adjusted comparison result, generates a reference current, and outputs the reference current to the second comparator 105. The second comparator 105 compares the input current with the reference current and outputs a fourth comparison result obtained after the comparison to the pulse width modulator 107.

The pulse width modulator 107 performs a pulse width modulation on the fourth adjusted comparison result and outputs the fourth modulated comparison result as a control signal to at least one switch circuit of the power factor correction circuit.

It should be noted that the reference current generating circuit may preferably include a mixer 102, a mean square error calculating circuit 103, and a squaring circuit 104.

As another example, in order to accurately control the cyclic feedback of the current and the voltage, the controller of the power factor correction circuit may preferably further include a current loop and a voltage loop.

In a preferred embodiment of the present invention, the control circuit 83 preferentially controls the current loop using the adjusted control parameter of the PID or the PI to adjust a control signal of at least one switch circuit of the power factor correction circuit. A reason for this is that a purpose of the power factor correction circuit is to adjust the voltage and the current to be in the same phase, and the current is the adjustment target of the power control circuit. Therefore, adjusting the PID parameter of the current loop effectively affects sensitivity of the circuit to an electrical environment. In combination with the above-described preferred embodiments, a correlation between the PID parameter of the current loop and the number of deviations in the predetermined duration is great.

Figure 12:
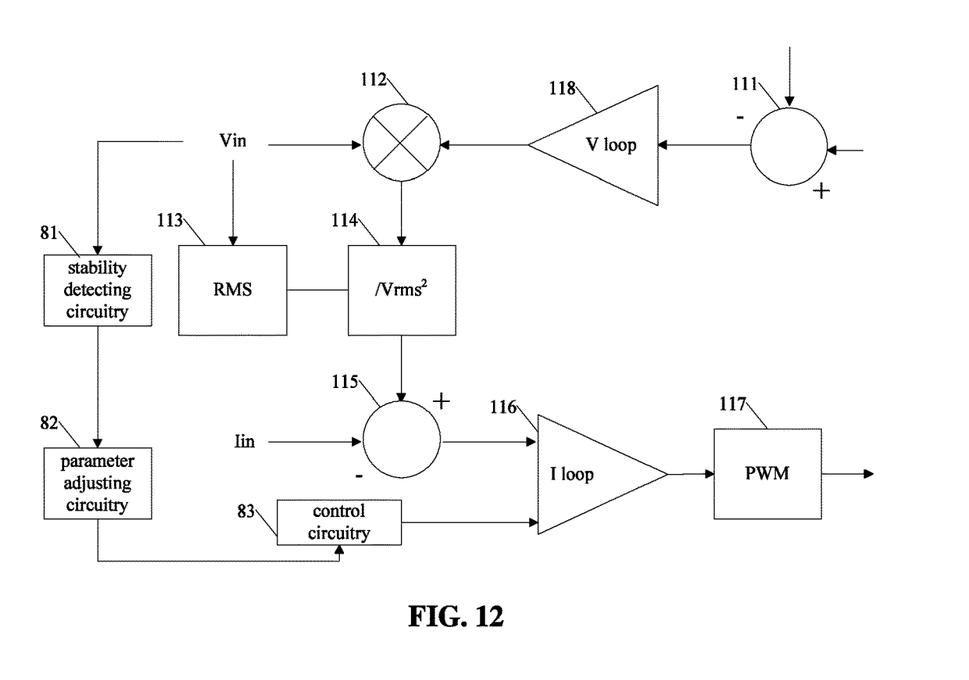
FIG. 12 schematically illustrates a structural diagram of a controller of a power factor correction circuit according to a preferred embodiment of the present invention.

FIG. 12 schematically illustrates a structural diagram of a controller of a power factor correction circuit according to a preferred embodiment of the present invention. As shown in FIG. 12, the controller includes a first comparator 111, a reference current generation circuit, a second comparator 115, a current PID loop 116, a voltage PID loop 118, a pulse width modulator 117, the stability detecting circuit 81, the parameter adjusting circuit 82, and the control circuit 83.

The first comparator 111 compares a target output voltage with a current output voltage and obtains a first comparison result.

The voltage PID loop 118 receives the first comparison result and adjusts the first comparison result.

The reference current generation circuit receives the current input voltage and the first comparison result adjusted by the voltage PID loop 118, generates a reference current, and outputs to the second comparator 115.

The second comparator 115 compares the input current with the reference current, and outputs a second comparison result obtained after the comparison to the current PID loop 116.

The stability detecting circuit 81 detects the stability degree of the input voltage of the power factor correction circuit. Moreover, the stability degree may preferably be the frequency and/or the amplitude of the input voltage deviating from the predetermined trend.

The parameter adjusting circuit 82 adjusts the current control parameter of the current PID according to the stability degree of the input voltage of the power factor correction circuit, wherein the control parameter may preferably include one or more of a proportional coefficient, an integral coefficient, and a differential coefficient.

The current PID loop 116 receives the second comparison result and the adjusted control parameter of the PID, adjusts the second comparison result according to the adjusted control parameter of the PID, and outputs the second adjusted comparison result. The pulse width modulator 117 performs a pulse width modulation on the second adjusted comparison result and outputs the second modulated comparison result as a control signal to the at least one switching circuit of the power factor correction circuit.

It should be noted that the reference current generating circuit may preferably be the reference current generating circuit in FIG. 12, and may preferably include a mixer 112, a mean square error calculating circuit 113, and a squaring circuit 114, whose function is not described in detail herein.

As another example, in order to accurately control the cyclic feedback of the current and the voltage, the controller of the power factor correction circuit may preferably further include a current loop and a voltage loop. The control circuit 83 preferentially controls the voltage loop by using the adjusted control parameter of the PID or the PI to adjust a control signal of at least one switch circuit of the power factor correction circuit, which facilitates circuit adjustment.

Figure 13:
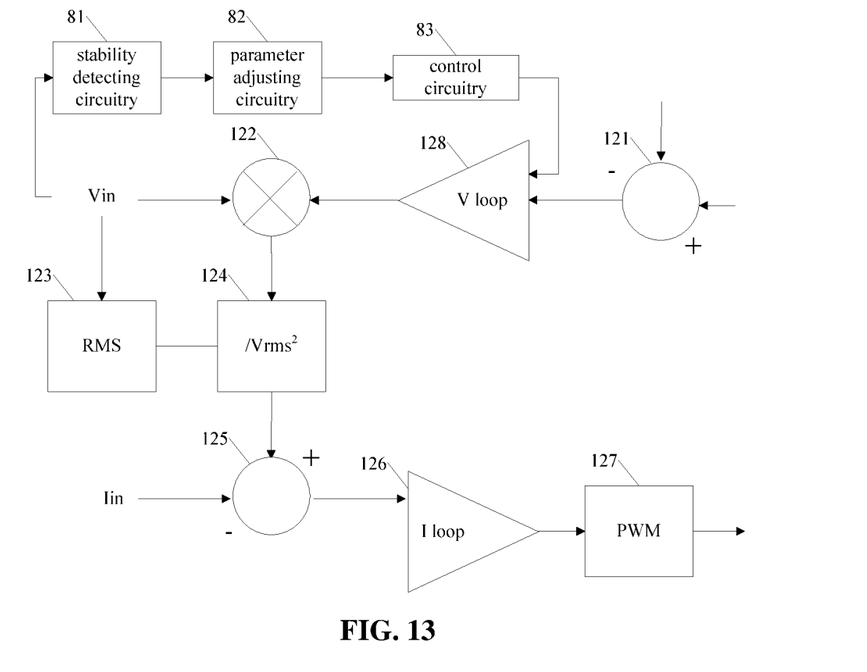
FIG. 13 schematically illustrates a structural diagram of a controller of a power factor correction circuit according to a preferred embodiment of the present invention.

FIG. 13 schematically illustrates a structural diagram of a controller of a power factor correction circuit according to a preferred embodiment of the present invention. As shown in FIG. 13, the controller includes a first comparator 121, a reference current generation circuit, a second comparator 125, a current PID loop 126, a voltage PID loop 128, a pulse width modulator 127, the stability detecting circuit 81, the parameter adjusting circuit 82, and the control circuit 83.

The first comparator 121 compares a target output voltage with a current output voltage and obtains a first comparison result.

The stability detecting circuit 81 receives the current input voltage, and detects the stability degree of the input voltage.

The parameter adjusting circuit 82 adjusts the current control parameter of the current PID according to the stability degree of the current input voltage, wherein the control parameter may preferably include one or more of a proportional coefficient, an integral coefficient, and a differential coefficient.

The control circuit 83 controls the current PID loop 128 by using the adjusted control parameter of the PID to adjust the control signal of the at least one switching circuit, wherein the adjusted control parameter of the PID maintains the power factor correction circuit at a predetermined stability degree.

The voltage PID loop 128 receives the third comparison result and the adjusted control parameter of the PID, and adjusts the third comparison result according to the adjusted control parameter of the PID.

The reference current generating circuit receives the current input voltage and the third adjusted comparison result, generates a reference current, and outputs the reference current to the second comparator 125. The second comparator 125 compares the input current with the reference current and outputs a fourth comparison result obtained after the comparison to the current PID loop 126.

The current PID loop 126 adjusts the fourth comparison result and outputs the fourth adjusted comparison result. The pulse width modulator 127 (PWM) performs a pulse width modulation on the fourth adjusted comparison result, and outputs the fourth modulated comparison result as a control signal to the at least one switching circuit of the power factor correction circuit.

It should be noted that the reference current generating circuit may preferably include a mixer 122, a mean square error calculating circuit 123, and a squaring circuit 124.

As another example, in order to accurately control the cyclic feedback of the current and the voltage, the controller of the power factor correction circuit may preferably further include a current loop and a voltage loop. The control circuit 83 simultaneously controls the current loop and the voltage loop by using the adjusted control parameter of the PID or the PI to adjust a control signal of the at least one switch circuit of the power factor correction circuit, which improves the circuit adjustment.

Figure 14:
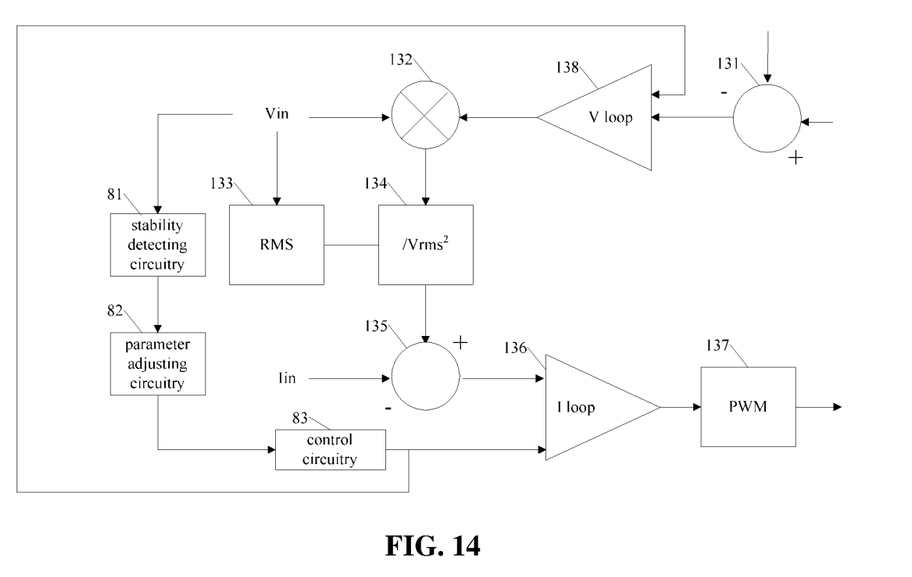
FIG. 14 schematically illustrates a structural diagram of a controller of a power factor correction circuit according to a preferred embodiment of the present invention.

FIG. 14 schematically illustrates a structural diagram of a controller of a power factor correction circuit according to a preferred embodiment of the present invention. As shown in FIG. 14, the controller includes a first comparator 131, a reference current generation circuit, a second comparator 135, a current PID loop 136, a voltage PID loop 138, a pulse width modulator 137, the stability detecting circuit 81, the parameter adjusting circuit 82, and the control circuit 83.

The first comparator 131 compares a target output voltage with a current output voltage and obtains a first comparison result.

The stability detecting circuit 81 receives the current input voltage and detects the stability degree of the input voltage.

The parameter adjusting circuit 82 adjusts the current control parameter of the current PID according to the stability degree of the current input voltage, wherein the control parameter may preferably include one or more of a proportional coefficient, an integral coefficient, and a differential coefficient, and a voltage PID control parameter and a current PID control parameter.

The control circuitry 83 controls the voltage PID loop 138 by using the adjusted voltage PID control parameter and control the current PID loop 136 by using the adjusted current PID control parameter, to adjust a control signal of at least one switching circuit of the power factor correction circuit. The voltage PID control parameter and the current PID control parameter jointly maintain the power factor correction circuit at a predetermined stability degree.

The voltage PID loop 138 receives the third comparison result and the adjusted voltage PID control parameter, and adjusts the third comparison result according to the adjusted control voltage PID control parameter. The reference current generating circuit receives the current input voltage and the third adjusted comparison result, generates a reference current, and outputs the reference current to the first comparator 135. The first comparator 135 compares the input current with the reference circuit, and outputs the fourth comparison result obtained after the comparison to the current PID loop 136.

The current PID loop 136 receives the fourth comparison result and the adjusted current PID control parameter, adjusts the fourth comparison result according to the adjusted current PID control parameter, and outputs the fourth comparison result after the adjustment.

The pulse width modulator 137 performs a pulse width modulation on the fourth adjusted comparison result, and outputs the fourth adjusted comparison result as a control signal to the at least one switching circuit of the power factor correction circuit.

It should be noted that the reference current generating circuit may preferably include a mixer 132, a mean square error calculating circuitry 133, and a squaring circuitry 134.

Preferred embodiments of the present invention further provide a system for a power factor correction circuit, wherein the system of the power factor correction circuit includes any one of the controllers of the power factor correction circuits according to the preferred embodiments described above, a power factor correction circuit, a power supply and a load. The power factor correction circuit corrects a power factor of the power supply. The power supply is coupled to an input end of the power factor correction circuit. The load is coupled to an output end of the power factor correction circuit.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for controlling a power factor correction circuit that includes a rectification circuit and at least one switching circuit, wherein the at least one switching circuit adjusts a current in the power factor correction circuit, the method comprising:

detecting a stability degree of an input voltage of the power factor correction circuit, wherein the stability degree is at least one of a frequency or an amplitude deviation of the input voltage from a predetermined trend;

adjusting a current control parameter of a proportion, integral, differential (PID) or a proportion, integral (PI) according to the stability degree of the input voltage of the power factor correction circuit, wherein the control parameter of the PID or the PI includes one or more of a proportional coefficient, an integral coefficient, and a differential coefficient; and controlling at least one of a voltage loop or a current loop using the adjusted control parameter of the PID or the PI to adjust a control signal of the at least one switching circuit, wherein the adjusted control parameter of the PID or the PI maintains the power factor correction circuit at a predetermined stability degree.

2. The method according to claim 1, wherein the detecting of the stability degree of the input voltage of the power factor correction circuit comprises:
sampling the input voltage of the power factor correction circuit;
calculating a number of times of the input voltage deviating from the predetermined trend by a predetermined value within a predetermined duration; and
determining a stability degree of the input voltage of the power factor correction circuit according to the number of times of the input voltage deviating from the predetermined trend by the predetermined value within the predetermined duration.

3. The method according to claim 2, wherein the adjusting of the current control parameter of the PID or the PI according to the stability degree of the input voltage of the power factor correction circuit comprises:
increasing the control parameter of the PID or the PI when the number of times of the input voltage deviating from the predetermined trend by the predetermined value is less than a second predetermined number threshold within the predetermined duration, wherein the second predetermined number threshold is less than a first predetermined number threshold.

4. The method according to claim 3, further comprising:
when the current control parameter of the PID exceeds a predetermined control parameter threshold range of the PID, restricting the current control parameter of the current PID to the control parameter threshold range of the PID.

5. The method according to claim 2, wherein sampling points for sampling the input voltage of the power factor correction circuit are set to a line that directly or indirectly reflects an alternating voltage change at an input end.

6. The method according to claim 2, wherein the adjusting of the current control parameter of the PID or the PI according to the stability degree of the input voltage of the power factor correction circuit comprises:
decreasing the control parameter of the PID or the PI when the number of times of the input voltage deviating from the predetermined trend by the predetermined value is greater than a first predetermined number threshold within the predetermined duration.

7. The method according to claim 6, wherein the adjusting of the current control parameter of the PID or the PI according to the stability degree of the input voltage of the power factor correction circuit comprises:
increasing the control parameter of the PID or the PI when the number of times of the input voltage deviating from the predetermined trend by the predetermined value is less than a second predetermined number threshold within the predetermined duration, wherein the second predetermined number threshold is less than the first predetermined number threshold.

8. The method according to claim 7, further comprising:
when the current control parameter of the PID exceeds a predetermined control parameter threshold range of the PID, restricting the current control parameter of the PID to the control parameter threshold range of the PID.

9. The method according to claim 1, wherein the detecting of the stability degree of the input voltage of the power factor correction circuit is performed according to a predetermined frequency.

10. A controller for a power factor correction circuit, the controller comprising:
a stability detecting circuitry to detect a stability degree of an input voltage of the power factor correction circuit, wherein the stability degree is at least one of a frequency or an amplitude deviation of the input voltage from a predetermined trend;
a parameter adjusting circuit to adjust a current control parameter of a proportion, integral, differential (PID) or a proportion, integral (PI) according to the stability degree of the input voltage of the power factor correction circuit, wherein the control parameter of the PID or the PI includes one or more of a proportional coefficient, an integral coefficient, and a differential coefficient; and
a control circuit to control at least one of a voltage loop or a current loop using the adjusted control parameter of the PID or the PI to adjust a control signal of the at least one switching circuit, wherein the adjusted control parameter of the PID or the PI maintains the power factor correction circuit at a predetermined stability degree.

11. The controller according to claim 10, wherein the control parameter of the PID includes at least one of a proportional gain parameter and an integral gain parameter.

12. The controller according to claim 10, wherein the control parameter of the PID includes at least one of a proportional gain parameter, an integral gain parameter, and a differential gain parameter.

13. The controller according to claim 10, further comprising:
a current loop; wherein
a control circuit controls the current loop to adjust the control signal of the at least one switching circuit in the power factor correction circuit by using the adjusted control parameter of the PID or the PI.

14. The controller according to claim 10, further comprising:
a current loop and a voltage loop; wherein
a control circuit controls the current loop to adjust the control signal of the at least one switching circuit in the power factor correction circuit by using the adjusted control parameter of the PID or the PI.

15. A system for a power factor correction circuit, comprising:
the controller according to claim 10;
a power factor correction circuit;
a power supply; and
a load; wherein
the power factor correction circuit corrects a power factor of the power supply;
the power supply is coupled to an input end of the power factor correction circuit; and
the load is coupled to an output end of the power factor correction circuit.

16. The system according to claim 15, wherein the control parameter of the PID includes at least one of a proportional gain parameter and an integral gain parameter.

17. The system according to claim 15, wherein the control parameter of the PID includes at least one of a proportional gain parameter, an integral gain parameter, and a differential gain parameter.

18. The system according to claim 15, further comprising:
a current loop; wherein
a control circuit controls the current loop to adjust the control signal of the at least one switching circuit in the power factor correction circuit by using the adjusted control parameter of the PID or the PI.

19. The system according to claim 15, further comprising:
a current loop and a voltage loop; wherein
a control circuit controls the current loop to adjust the control signal of the at least one switching circuit in the power factor correction circuit by using the adjusted control parameter of the PID or the PI.

* * * * *